US008884629B1

(12) United States Patent
Kumar et al.

(10) Patent No.: US 8,884,629 B1
(45) Date of Patent: Nov. 11, 2014

(54) BACKGROUND SENSOR DIAGNOSTIC FOR MULTI-CHANNEL ADC

(75) Inventors: D V J Ravi Kumar, Bangalore (IN); Theertham Srinivas, Bangalore (IN); Gururaj Ghorpade, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 521 days.

(21) Appl. No.: 13/103,894

(22) Filed: May 9, 2011

Related U.S. Application Data

(60) Provisional application No. 61/367,282, filed on Jul. 23, 2010.

(51) Int. Cl.
G01R 31/02 (2006.01)
H03M 1/10 (2006.01)
H03M 1/12 (2006.01)

(52) U.S. Cl.
CPC .............. G01R 31/024 (2013.01); H03M 1/122 (2013.01); H03M 1/1004 (2013.01)
USPC ........... 324/537; 324/523; 324/555; 341/120; 341/141

(58) Field of Classification Search
CPC .............. G01K 15/00–15/007; G01K 31/2829; G01K 31/024–31/026; H03M 1/1004; H03M 1/122
USPC .................. 324/500, 522, 537, 555, 523; 702/182–185; 341/118–121, 141; 370/241, 250, 251
See application file for complete search history.

(56) References Cited

U.S. PATENT DOCUMENTS

| | | | | |
|---|---|---|---|---|
| 3,791,217 A | * | 2/1974 | Stout et al. | 374/167 |
| 4,571,689 A | * | 2/1986 | Hildebrand et al. | 702/58 |
| 4,951,051 A | | 8/1990 | Place | |
| 5,153,835 A | * | 10/1992 | Hashimoto et al. | 701/114 |
| 5,406,485 A | | 4/1995 | Wise et al. | |
| 5,703,575 A | * | 12/1997 | Kirkpatrick | 340/870.17 |
| 5,754,963 A | | 5/1998 | Nunneley et al. | |
| 5,848,381 A | | 12/1998 | Ishii et al. | |
| 5,950,597 A | | 9/1999 | Kamio et al. | |
| 5,983,714 A | | 11/1999 | Izumiura et al. | |

(Continued)

OTHER PUBLICATIONS

"LC2MOS Signal Conditioning ADC with RTD Current Source," AD7711A*, Analog Devices Data Sheet, pp. 1-28.

(Continued)

Primary Examiner — Huy Q Phan
Assistant Examiner — James Split
(74) Attorney, Agent, or Firm — Andrew Viger; Frederick J. Telecky, Jr.

(57) ABSTRACT

A digital sensing device includes a sensor diagnostic system for detecting sensor fault conditions. The sensor diagnostic system including an input multiplexer applying a first burnout current or a second burnout current to a selected input channel and a near-rail detector configured to detect when an input voltage of the digital sensing device is near a positive power supply or near a negative power supply. The burnout current injection is applied without interfering with the sensor data. In other embodiments, the sensor diagnostic system may further include an overload detector configured to detect an overflow or underflow condition at the analog-to-digital converter. The sensor diagnostic system may further include a window comparator to detect when the ADC digital output is near a zero digital value. Finally, the sensor diagnostic system may further include a sensor flag generator to generate data flags indicative of sensor fault conditions.

19 Claims, 7 Drawing Sheets

(56) References Cited

U.S. PATENT DOCUMENTS

| | | | |
|---|---|---|---|
| 6,014,091 | A | 1/2000 | Noltemeyer et al. |
| 6,772,082 | B2 | 8/2004 | van der Geest et al. |
| 6,958,717 | B1 * | 10/2005 | Minogue ............. 341/102 |
| 7,005,833 | B2 | 2/2006 | Adams |
| 7,474,247 | B1 | 1/2009 | Heinks et al. |
| 7,525,318 | B2 * | 4/2009 | Endoh ............. 324/522 |
| 7,626,399 | B2 * | 12/2009 | Crockett et al. ............. 324/539 |
| 7,656,303 | B2 | 2/2010 | Inoue et al. |
| 7,667,631 | B1 * | 2/2010 | Zhu ............. 341/141 |
| 8,009,078 | B1 * | 8/2011 | Alley ............. 341/155 |
| 2009/0128160 | A1 | 5/2009 | Chiaburu et al. |

OTHER PUBLICATIONS

"LTC2400, 24-Bit µPower No Latency $\Delta\Sigma$™ ADC in SO-8," Linear Technology Data Sheet, pp. 1-40.

"Max 1402, +5V, 18-Bit, Low-Power, Multichannel, Oversampling (Sigma-Delta) ADC," MAXIM Data Sheet, pp. 1-38.

"ADS1242, ADS1243, 24-Bit Analog-To-Digital Converter," Texas Instruments Data Sheet, pp. 1-31.

* cited by examiner

BACKGROUND SENSOR DIAGNOSTIC FOR MULTI-CHANNEL ADC

CROSS-REFERENCE TO RELATED APPLICATION

This application claims the benefit of U.S. Provisional Patent Application Ser. No. 61/367,282, filed on Jul. 23, 2010, of D V J Ravi Kumar et al., which application is incorporated herein by reference in its entirety.

FIELD OF THE INVENTION

The invention relates to sensor diagnostic methods and systems and, in particular, to sensor diagnostics that are performed continuously in the background.

DESCRIPTION OF THE RELATED ART

Digital sensing systems operative to digitize measurement signals taken by a sensor have been applied to measure various environmental or physical quantities, such as temperature, pressure, and humidity. A typical digital sensing system includes an analog-to-digital converter (ADC) configured to digitize analog signals generated by a sensor coupled thereto. Temperature is the most-often measured environmental quantity since most physical, electronic, chemical, or mechanical systems are affected by temperature. Digital temperature sensing systems includes a temperature sensing device (or "temperature sensor") for measuring the temperature of an object or at a target and an analog-to-digital converter (ADC) for digitizing the temperature measurements and generating digital output data indicative of the measured temperature. FIG. 1 illustrates a conventional digital temperature sensing system 1 including a digital sensing device 2, typically including at least an analog-to-digital-converter, configured to measure temperature readings taken by a thermocouple (Tc) 3. FIG. 2 illustrates a conventional digital temperature sensing system 4 including a digital sensing device 5, typically including at least an analog-to-digital-converter, configured to measure temperature readings taken by a resistance temperature detector (RTD) 6.

In a digital sensing system where an analog-to-digital converter (ADC) is used to digitize measurements from a sensor, the sensor may be located at a great distance from the ADC, such as more than hundreds of feet. The sensor may suffer from many different types of fault condition (open or short) which are often difficult to detect because many fault conditions appear to the ADC as valid input levels. The ability to reliability detect a fault condition at a remote sensor is desired. Conventional fault detection techniques include injecting a burnout current to all of the ADC input channels. In other cases, an open circuit detector or a separate ADC for monitoring the sensor may be used. Conventional fault detection techniques are not desirable as they often are not capable of detecting all or most sensor fault conditions. The conventional fault detection techniques often slow down the total conversion rate of the digital sensing device as the ADC output is used for performing sensor diagnostic, thus interfering with the measurements.

DETAILED DESCRIPTION OF THE PREFERRED EMBODIMENTS

Figure 1:
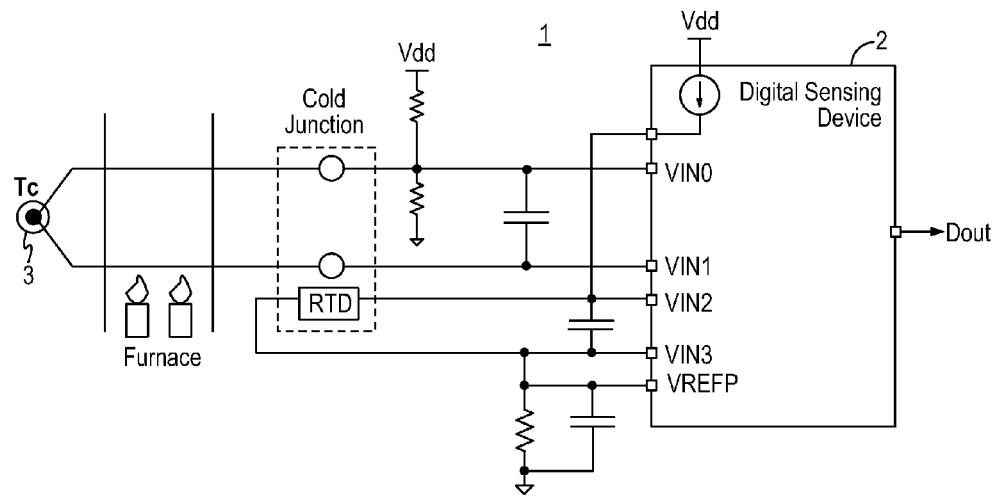
FIG. 1 illustrates a conventional digital temperature sensing system configured to measure temperature readings taken by a thermocouple (Tc).
Figure 2:
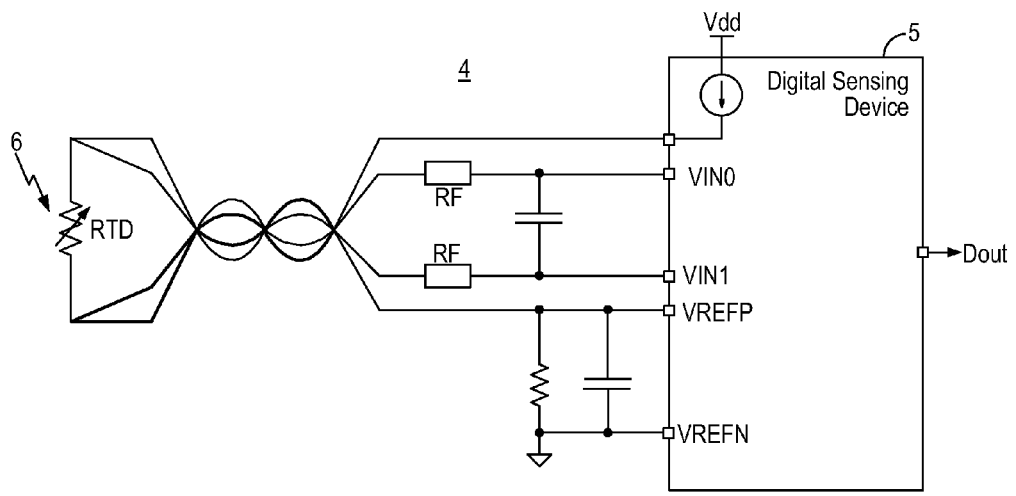
FIG. 2 illustrates a conventional digital temperature sensing system configured to measure temperature readings taken by a resistance temperature detector (RTD).

According to the principles of the present invention, a background sensor diagnostic system is incorporated in a digital sensing device with a multi-channel analog-to-digital converter (ADC) to detect fault conditions associated with a sensor coupled to the digital sensing device. In one embodiment, the background sensor diagnostic system implements channel-specific burnout current injection so that sensor diagnostics carried out only in the background without interfering with the normal operation of the digital sensing device. In some embodiments, the background sensor diagnostic system implements multiple fault detection techniques to detect various sensor fault conditions. In this manner, the background sensor diagnostic system of the present invention realize effective sensor diagnostic for all or nearly all sensor fault conditions associated with different types of sensors, especially for remotely located sensors. In some embodiments, the background sensor diagnostic system generates data flags indicating detected fault conditions.

In embodiments of the present invention, the background sensor diagnostic system is configured to detect one or more of the following sensor fault conditions:

(1) an open circuit at the sensor;
(2) a short circuit at the sensor, including a short circuit to the most positive power supply (Vdd) or a short circuit to ground or to the most negative power supply (Vss);
(3) an ADC overflow, underflow or out-of-range condition; and
(4) a missing or defective sensor reference voltage.

In embodiments of the present invention, the background sensor diagnostic system of the present invention is configured to monitor one input channel of the multi-channel ADC. In other embodiments, the background sensor diagnostic system is configured to monitor some or all input channels of the multi-channel ADC. More specifically, the background sensor diagnostic system implements channel-specific burnout current injection which is operative to inject burnout current to a specific input channel of the ADC or to some or all input channels of the ADC. In some embodiments, when the channel-specific burnout current injection is operated in a "scan mode," the burnout current is injected onto an input channel that is not currently being evaluated by the ADC. In this manner, normal ADC operation is not affected and sensor diagnostics is carried out entirely in the background of the normal operation of the digital sensing device for sensing measurements from the associated sensor, without requiring user intervention.

In embodiments of the present invention, the background sensor diagnostic system of the present invention further includes a near-rail detector operating in the analog domain to detect when the analog input signal is near the power and negative power rails (Vdd and ground). The near-rail detector is instrumental in detecting an open circuit condition at the sensor or a floating input node at the sensor that may cause the analog input signal to drift to the power rails.

In other embodiments, the background sensor diagnostic system further includes a window comparator operating in the digital domain for detecting a short circuit condition at the sensor. In yet other embodiments, the background sensor diagnostic system further includes an ADC overload detector for detecting overflow and underflow conditions at the ADC of the digital sensing device.

In some embodiments, the background sensor diagnostic system is applied to a digital temperature sensing system. The background sensor diagnostic system is capable of detecting sensor faults associated with a variety of temperature sensors, including RTDs, themistors and thermocouples, and with a variety of sensor configurations, including two-wire, three-wire or four-wire RTD configurations.

Digital Sensing Device Incorporating Background Sensor Diagnostic

Figure 3:
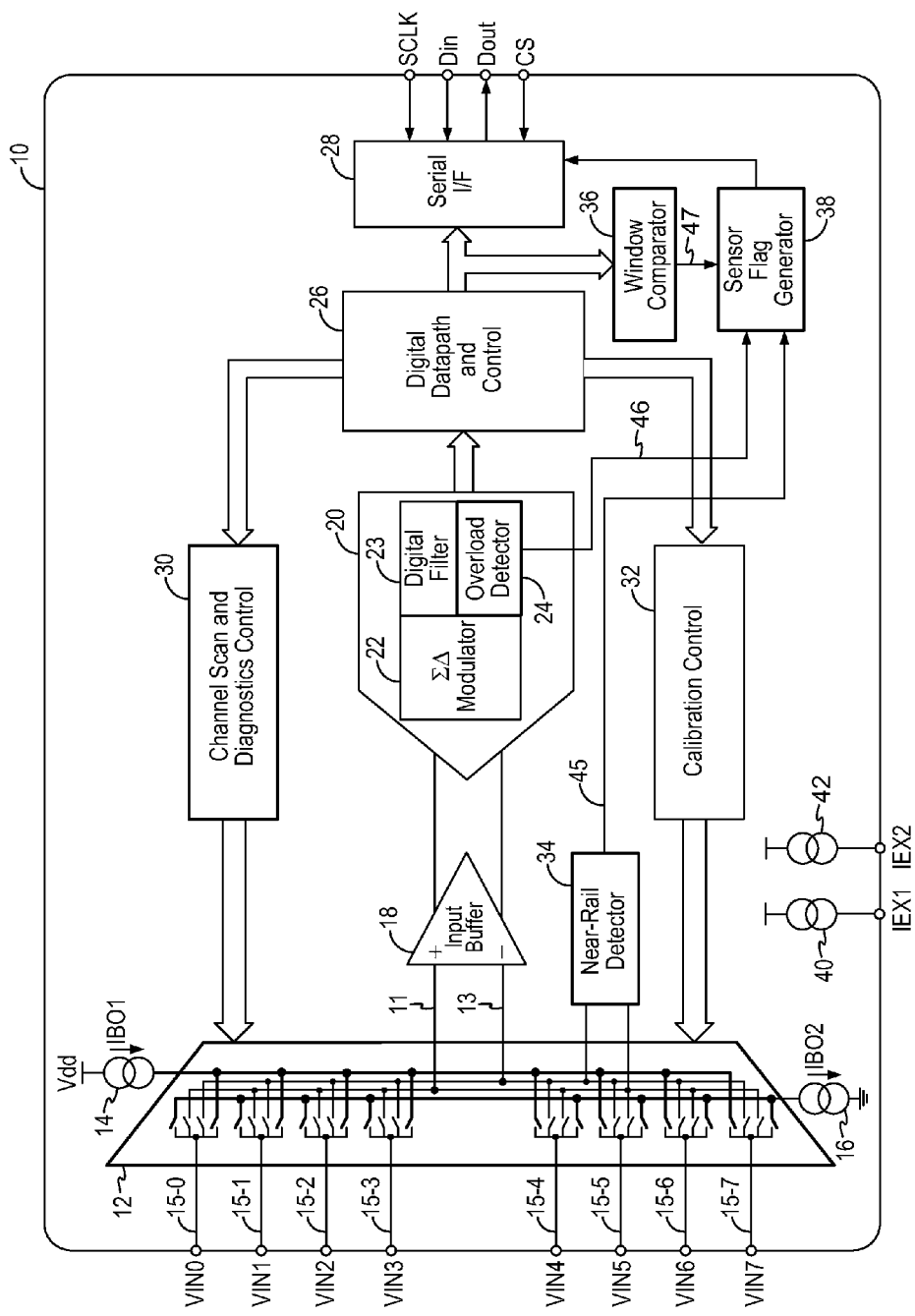
FIG. 3 is a block diagram of a digital sensing device incorporating a background sensor diagnostic system according to one embodiment of the present invention.

FIG. 3 is a block diagram of a digital sensing device incorporating a background sensor diagnostic system according to one embodiment of the present invention. Referring to FIG. 3, a digital sensing device 10 includes an input multiplexer 12 with multiple input channels to interface with a remote sensor. In the present embodiment, the input multiplexer 12 includes eight input channels 15-0 to 15-7 receiving eight input signals VIN0 to VIN7. The eight input channels 15-0 to 15-7 can be used to form four differential input channels or seven single-ended input channels. The input multiplexer 12 includes a set of switches coupled to each input channel 15-0 to 15-7 for connecting each input signal to either a positive input terminal 11 or a negative input terminal 13 of an input buffer 18. For differential input channels, each effective input voltage that is digitized by the digital sensing device 10 is given as: VIN=VINx−VINy, where $0 \le x \le 7$ and $0 \le y \le 7$. For single-ended input channels, the input multiplexer 12 is configured to receive seven single-ended input signals with any one of the input signals VIN0 to VIN7 functioning as the common ground reference.

In the present embodiment, the input multiplexer 12 is also configured to receive a pair of burnout currents IBO1 and IBO2 for sensor diagnostic. The burnout currents IBO1 and IBO2 are coupled to the input channels 15-0 to 15-7 though switches in the input multiplexer 12 so that channel-specific burnout current injection may be implemented, as will be described in more detail below.

After a pair of input signals VIN0 to VIN7 is selected by the input multiplexer 12, the selected input signals are coupled to the input buffer 18 to be buffered. The selected input signals may form a differential input signal or may be a single-ended input signal with the reference signal. The buffered input signal (differential or single-ended) is then provided to an analog-to-digital converter (ADC) 20 to be digitized. In the present embodiment, ADC 20 is a ΣΔ ADC formed by a ΣΔ modulator 22 as the analog front end circuit and a digital filter 23 as the digital post processing circuit. The ΣΔ modulator 22 samples the analog input signal (differential or single-ended) provided by buffer 18 and generates a single bit digitized data stream having an ones density representative of the magnitude of the analog input signal. The digital filter 23 processes the ones density data stream and generates a single digital value indicative of the relative frequency of occurrence of the many logical "1" values in the digitized data stream within some time interval. The single digital value is therefore an estimate of the average magnitude of the analog input signal at the ADC input during that time interval.

In the present embodiment, ADC 20 also includes an overload detector 24 for detecting overflow and underflow conditions at the ADC, as will be described in more detail below. More specifically, the overload detector 24 determines if the digital output value of the ADC has become out-of-range.

Over many conversion cycles, ADC 20 generates digital values indicative of the analog input signal presented at its input terminals. The digital values are passed to a digital datapath and control block 26 and then passed to a serial interface (I/F) block 28 where the digital values can be output to systems outside of the digital sensing device 10 through the serial data out port Dout. In the present embodiment, the digital sensing device 10 interfaces with other systems through a serial interface. The serial I/F block 28 receives a system clock signal (SCLK), a chip select signal (CS) and a serial data in signal (Din) as input signals and provides serial data output signal (Dout) as output signals. In other embodiments, other data interface, such as a parallel data bus, may be used.

In the present embodiment, digital sensing device 10 further includes a channel scan and diagnostics control block 30 which receives control signals from the digital datapath and control block 26 and generates channel scan and diagnostics control signals for the input multiplexer 12.

In the present embodiment, digital sensing device 10 further includes a calibration control block 32 operative to control and perform calibration of the ADC. Digital sensing device 10 further includes two excitation current sources 40, 42 providing excitation currents IEX1 and IEX2 to the external sensor where needed.

In the present embodiment, digital sensing device 10 includes a near-rail detector 34 coupled to the input multiplexer 12 for detecting when the analog input signal selected by the input multiplexer is near the power and negative power rails (Vdd and ground).

In the present embodiment, digital sensing device 10 includes a window comparator 36 coupled to receive the digital values generated by the ADC 20 at the output of the digital datapath and control block 26. Window comparator 36 is operative to determine of the digital values of the ADC is within a certain window which may indicate a short condition at the sensor.

In the present embodiment, digital sensing device 10 includes a sensor flag generator 38 which receives status data values from the near-rail detector 34, the overload detector 24 and the window comparator 36. The status data values indicate detector fault conditions. The sensor flag generator 38 generates data flags indicative of the detected fault conditions and provides the data flags to the serial I/F block 28. An external control system communicating with the digital sensing device 10 may retrieve the data flags through the serial I/F block 28.

According to embodiments of the present invention, the digital sensing device 10 incorporates a background sensor diagnostic system for detecting multiple sensor fault conditions. The background sensor diagnostic system in the digital sensing device 10 is formed to include the input multiplexer 12 implementing channel-specific current injection from burnout current sources 14 and 16, the near rail detector 34, the overload detector 24 and the window comparator 36. Furthermore, in the present embodiment, the background sensor diagnostic system further includes the sensor flag generator 38 for generating data flags indicative of detected fault conditions. The operation of each component of the background sensor diagnostic system of the present invention will be described in more detail below.

Channel-Specific Burnout Current Injection

Figure 4:
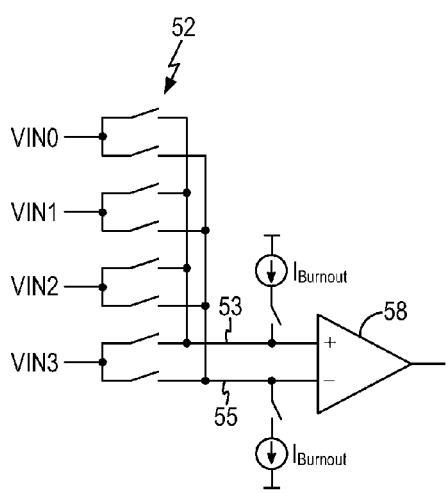
FIG. 4 is a schematic diagram of a conventional burnout current injection technique for a digital sensing system.

Injection of burnout currents to the sensor is often necessary to detect sensor fault conditions. Conventional burnout current injection is carried out by injecting the burnout currents to all of the input channels of the digital sensing device at once, as shown in example in FIG. 4. Referring to FIG. 4, a conventional digital sensing device includes an input multiplexer 52 coupled to receive input signals from multiple input channels. The burnout current sources are coupled to inject burnout currents at the positive and negative input terminals 53, 55 of the input buffer 58. As thus configured, the burnout currents are injected to all of the input channels at the same time and the additional currents introduced to all of the input channels will interfere with normal ADC operation and may slow down the ADC conversion rate.

Figure 5:
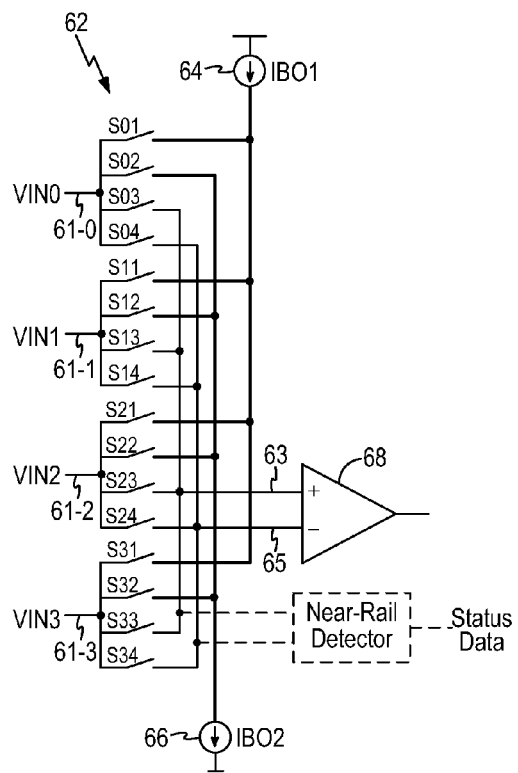
FIG. 5 is a schematic diagram of an input multiplexer of a digital sensing system incorporating channel specific burnout current injection according to one embodiment of the present invention.

According to embodiments of the present invention, the background sensor diagnostic system implements channel-specific burnout current injection to inject the burnout currents to selected input channel only without injecting the burnout currents to all of the input channels at the same time. FIG. 5 is a schematic diagram of an input multiplexer of a digital sensing system incorporating channel specific burnout current injection according to one embodiment of the present invention. Referring to FIG. 5, an input multiplexer 62 includes four input channels 61-0 to 61-3 coupled to receive four input signals VIN0 to VIN3. Each input channel is coupled to a set of four switches. For example, input channel 61-0 is coupled to switches S01 to S04 and input channel 61-1 is coupled to switches S11 to S14. The input multiplexer 62 includes a first current source 64 providing a sourcing burnout current IBO1 from the positive power supply Vdd and a second current source 66 providing a sinking burnout current IBO2 to ground.

In each set of switches for an input channel, a first switch (S01, S11, S21, and S31) connects the input channel to the sourcing burnout current IBO1, a second switch (S02, S12, S22 and S32) connects the input channel to the sinking burnout current IBO2, a third switch (S03, S13, S23 and S33) connects the input channel to the positive input terminal 63 of the input buffer 68, being the input buffer to the ADC in the digital sensing device, and finally, a fourth switch (S04, S14, S24 and S34) connects the input channel to the negative input terminal 65 of the input buffer 68.

Through the use of the sets of switches in the input multiplexer 62, current injection to a desired input channel can be effectuated by closing switches only for the desired channel to enable the current injection while leaving switches open when current injection is not desired. For example, when burnout current injection for the input channel 61-0 is desired, switches S01 is closed while switches S11, S21 and S31 are open. Accordingly, burnout current IBO1 is injected into input signal VIN0 but not the other input signals. Burnout current IBO1 serves as a pull-up current for pulling the selected input channel up to the positive power supply Vdd. Burnout current IBO2 serves as a pull-down current for pulling the selected input channel down to ground. In embodiment, burnout current IBO1 is a 10 μA current and burnout current IBO2 is also a 10 μA current.

Figure 6:
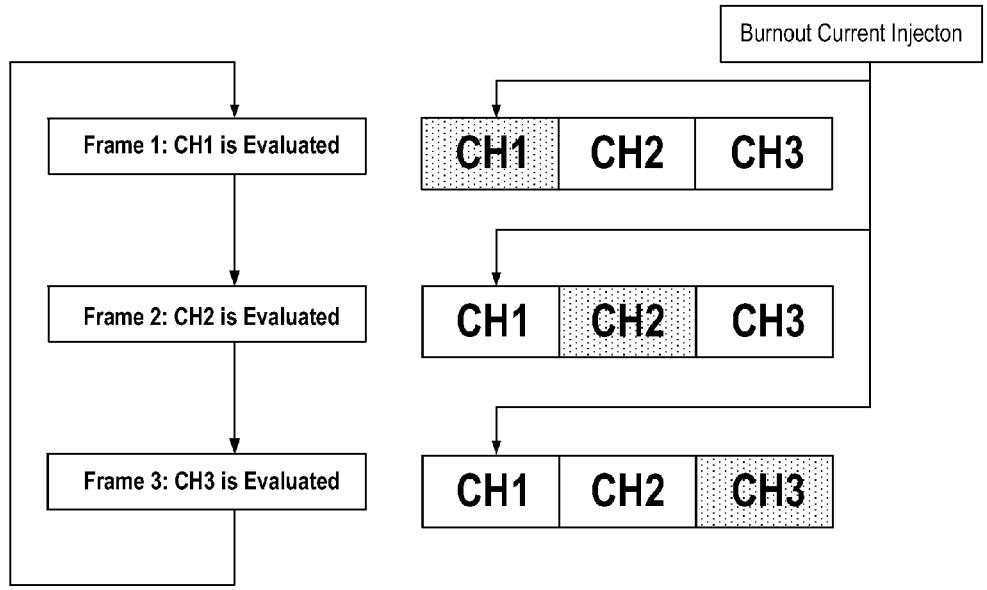
FIG. 6 illustrates the burnout current injection operation using a single channel current injection operation mode according to one embodiment of the present invention.

According to embodiments of the present invention, the input multiplexer can be operated in two modes to inject burnout current to a specific channel. In one embodiment, the input multiplexer is operated in a single channel current injection mode, as shown in FIG. 6. Referring to FIG. 6, assuming there are three input channels each being evaluated by the ADC in sequence. In Frame 1, input channel CH1 is evaluated. In Frame 2, input channel CH2 is evaluated, and so on. The input multiplexer (12 or 62) can be configured to inject the burnout current to the first input channel CH1. Thus, when channel CH1 is being evaluated, it is also receiving the burnout current. However, when channel CH2 and channel CH3 are being evaluated, the current injection remains at channel CH1.

Figure 7:
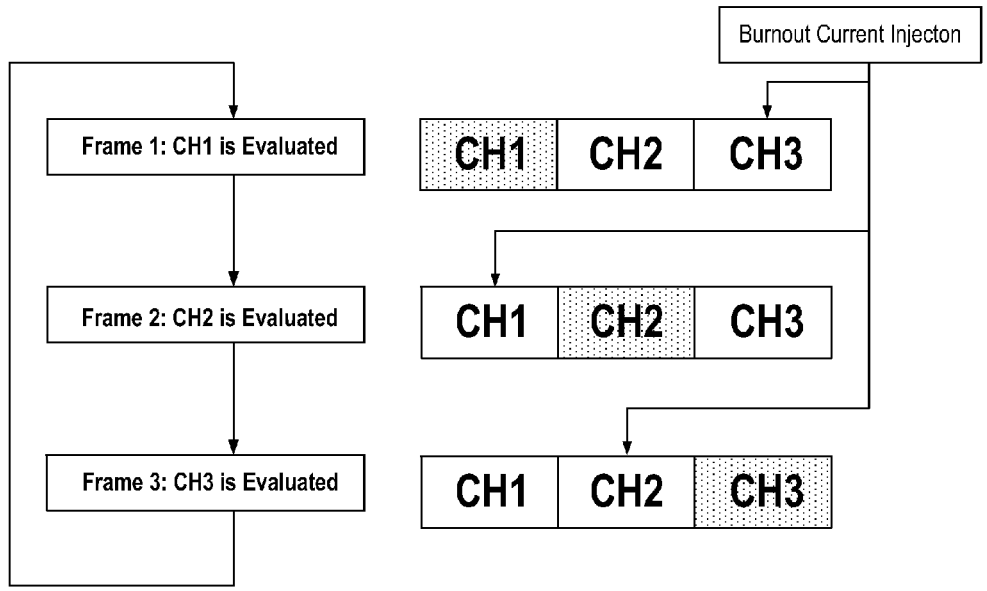
FIG. 7 illustrates the burnout current injection operation using an automatic channel scan injection operation mode according to one embodiment of the present invention.

In another embodiment, the input multiplexer is operated in an automatic channel scan injection mode, as shown in FIG. 7. Referring to FIG. 7, the ADC is operating to evaluate channel CH1, CH2 and CH3 in order in each successive frames. In the automatic channel scan injection mode, the burnout current injection is applied to a channel that is not currently being evaluated by the ADC so that the sensor diagnostic operation does not impact the data rate of the ADC and does not change the input signal from the sensor which is supplied to the ADC for digitizing. Rather, current injection is applied to the last channel that was evaluated. Therefore, in Frame 1 when channel CH1 is being evaluated, the automatic channel scan injection mode injects the burnout current to channel CH3 being the previous channel that was evaluated. Then, in Frame 2 when channel CH2 is being evaluated, the automatic channel scan injection mode injects the burnout current to channel CH1 being the previous channel that was evaluated. The scan mode operation continues in Frame 3 to inject the burnout current to channel CH2 when channel CH3 is being evaluated.

Burnout current injection are useful in sensor diagnostics for detecting open and short conditions. When there is an open circuit at the sensor, injecting a sourcing burnout current at the open-circuit sensor connection will quickly pull the voltage at the node up to the positive power supply or pull the voltage at the node down to the negative power supply, both of the conditions can be measured to detect the open circuit. When there is a short circuit, injecting a sourcing or sinking burnout current at the short-circuited sensor connection will cause a change in resistance which can be measured to detect the short circuit.

Near Rail Detector (Analog)

In one embodiment, the near-rail detector 34 (FIG. 3) is used to detect when the input voltage level is near the power supply rails. The near-rail detector 34 has input terminals coupled to the positive input terminal 11 and the negative input terminal 13 of the input buffer 18. Thus, the near-rail detector 34 detects the voltages of the selected input channels which are being provided to input buffer 18. The near-rail detector 34 generates status data on a data bus 45 which is provided to the sensor flag generator 38 to generate data flags indicative of the sensor fault condition. As thus configured, the near-rail detector 34 detects the conditions of the selected voltages in the analog domain and near the input of the digital sensing device. Therefore near-rail detector 34 can determine sensor fault condition quickly, without waiting for the ADC conversion operation. The near-rail detector 34 is useful in detecting an open circuit or a floating node at the sensor.

In the present embodiment, the near-rail detector 34 actually includes a pair of detectors for detecting each of the selected input channels (node 11 or node 13). The near-rail detector 34 asserts a first status data (bus 45) when the voltage VINx on one of the selected input channels (e.g. node 11) is near the positive power supply voltage Vdd or near the negative power Vss or ground. Furthermore, the near-rail detector 34 asserts a second status data (bus 45) when the voltage VINy on the other one of the selected input channels (e.g. node 13) is near the positive power supply voltage Vdd or near the negative power Vss or ground.

Figure 8:
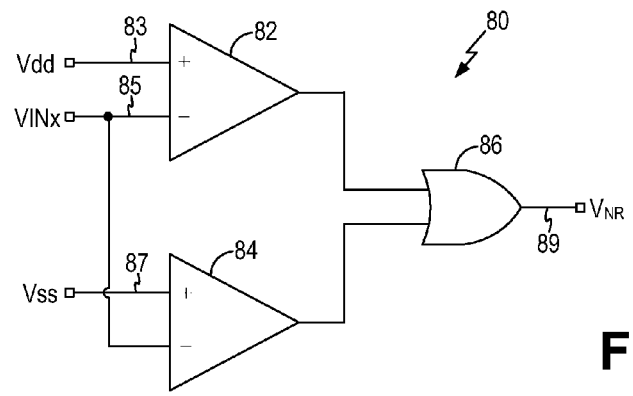
FIG. 8 is a schematic diagram of a near-rail detector which can be incorporated in the digital sensing system of FIG. 3 according to one embodiment of the present invention.

FIG. 8 is a schematic diagram of a near-rail detector which can be incorporated in the digital sensing system of FIG. 3 according to one embodiment of the present invention. Referring to FIG. 8, a near-rail detector 80 includes a first comparator 82 for comparing the selected input voltage VINx (node 85) to the positive power supply voltage (node 83), a second comparator 84 for comparing the selected input voltage VINx to the negative power supply voltage (node 84), and an OR gate to perform a logical "OR" operation on the output of the two comparators 82, 84. The near-rail detector 80 generates a status data $V_{NR}$ on an output node 89.

Figure 9:
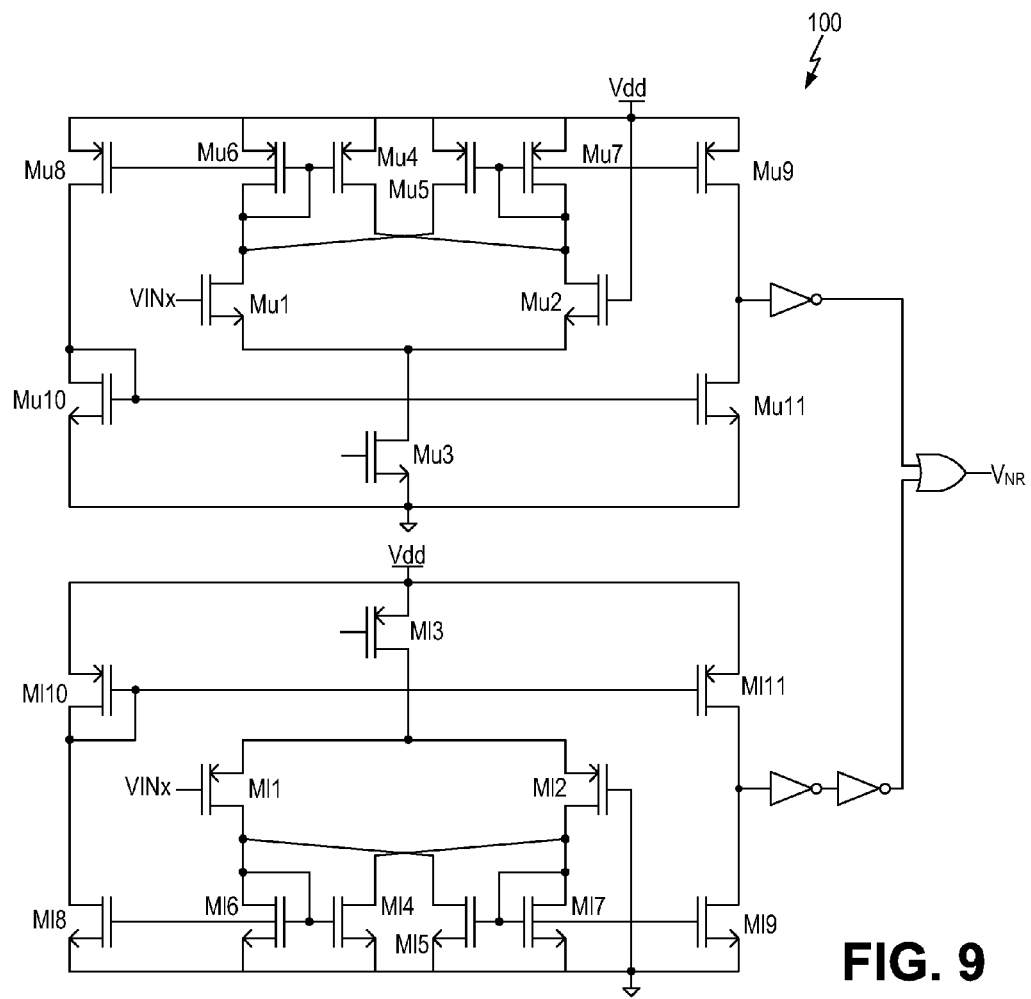
FIG. 9 is a transistor-level circuit diagram of a near-rail detector which can be used to implement the near-rail detector of FIG. 8 according to one embodiment of the present invention.

In the present embodiment, the near-rail detector 34 of FIG. 3 will include a pair of near-rail detectors 80 to detect a first selected input voltage VINx (node 11) and a second selected input voltage VINy (node 13). FIG. 9 is a transistor-level circuit diagram of a near-rail detector which can be used to implement the near-rail detector of FIG. 8 according to one embodiment of the present invention. The embodiment shown in FIG. 9 is illustrative only. The near-rail detector may be implemented using other circuit configurations in other embodiments.

Window Comparator (Digital)

In one embodiment, the window comparator 36 (FIG. 3) is used to detect when the output of the ADC 20 is within a given digital value range indicating a short condition. In the present embodiment, the window comparator 36 operates in the digital domain and is coupled to receive the digital values from the ADC 30 at the output of the digital datapath and control block 26. In other embodiments, the window comparator 36 may be coupled directly to the output of the ADC 20. The window comparator 36 generates status data on bus 47 which is provided to the sensor flag generator 38. Sensor flag generator 38 generate a data flag indicative of the sensor fault condition as indicated by the window comparison result.

Figure 10:
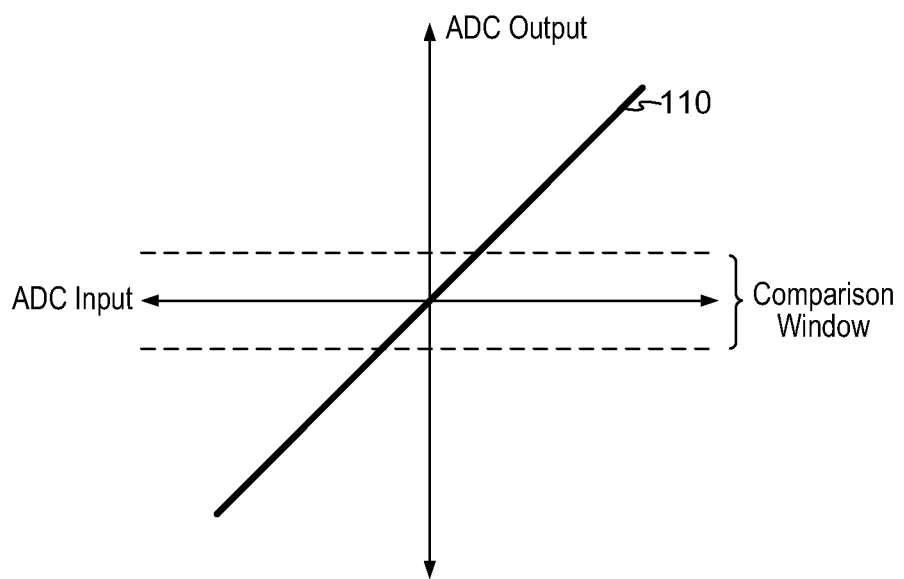
FIG. 10 illustrates the operation of a window comparator which can be incorporated in the digital sensing system of FIG. 3 according to one embodiment of the present invention.

FIG. 10 illustrates the operation of a window comparator which can be incorporated in the digital sensing system of FIG. 3 according to one embodiment of the present invention. The window comparator is provided with a comparison window to detect when the digital value generated by the ADC (the ADC output) is within the window. In one embodiment, the size of the comparison window is programmable by the user. The window comparator operates to determine if the ADC output is within a given threshold of zero voltage. An ADC output that is within the comparison window indicates a short condition at the sensor. The window comparator may be operator with burnout current injection to the sensor.

Overload Detection (Digital)

In one embodiment, the ADC overload detector 24 (FIG. 3) is used to detect overflow and underflow conditions at the ADC 20 in the digital domain. In the present embodiment, the ADC overload detector 24 is implemented inside the ADC 20 and monitors the string of consecutive ones or zeros generated by the IA modulator 22. When the number of consecutive ones or zeros becomes greater than a threshold value, then an ADC overflow or underflow condition is detected. The overload detector 24 generates status data on bus 46 which is provided to the sensor flag generator 38. Sensor flag generator 38 generate a data flag indicative of the sensor fault condition as indicated by the overload detection result. ADC overflow or underflow condition indicates a missing sensor reference voltage or a defective sensor reference voltage.

Figure 11:
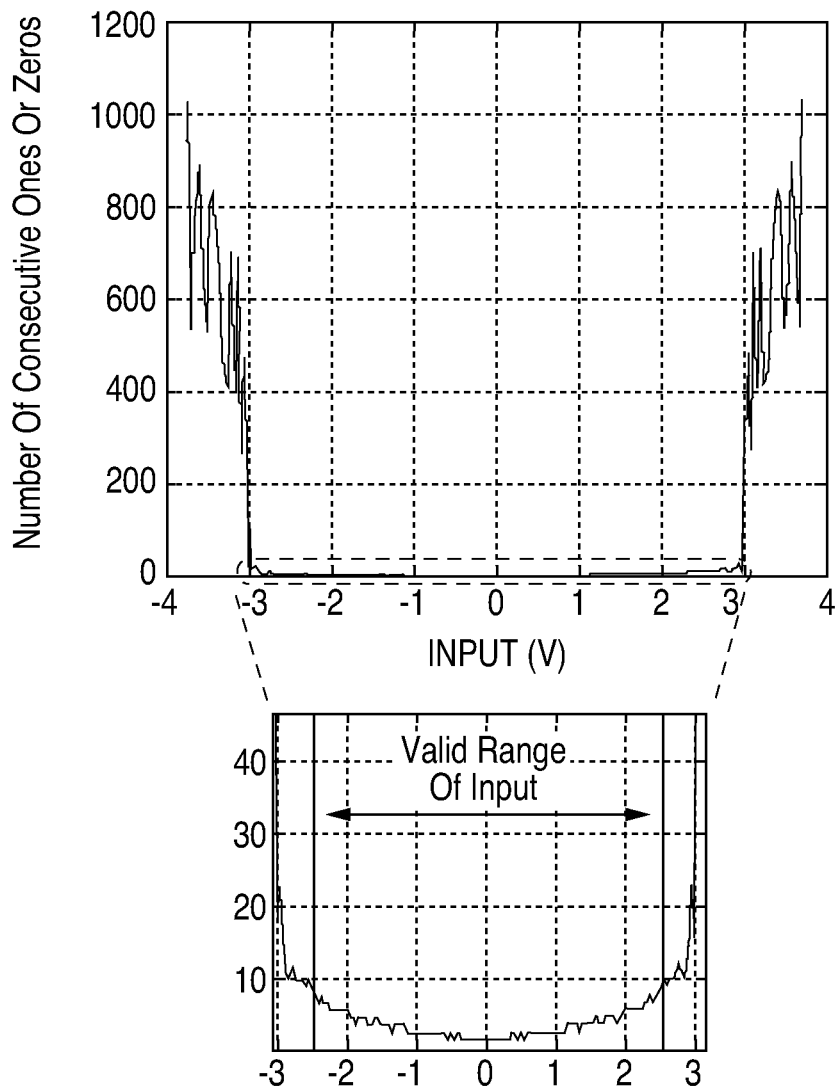
FIG. 11 illustrates the operation of an overflow detector which can be incorporated in the digital sensing system of FIG. 3 according to one embodiment of the present invention.

FIG. 11 illustrates the operation of an overflow detector which can be incorporated in the digital sensing system of FIG. 3 according to one embodiment of the present invention. Referring to FIG. 11, when the ADC input value is with the valid input voltage range, the number of consecutive ones or zeros will be within the range shown in the graph insert. When the ADC input becomes out of the ADC valid input range, the number of consecutive ones or zeros will be outside of the valid range, indicating a fault condition. In one embodiment, the ADC overload detector 24 implements a sinc filter to detect for ADC output saturation.

Fault Detection Flags

In embodiments of the present invention, when a fault condition is detected, the sensor flag generator 38 (FIG. 3) provides multiple data flags indicative of the detected fault condition. In one embodiment, the sensor flag generator 38 generates a first data flag indicating detection of a selected input voltage near the power supply rails (Vdd and Vss), a second data flag indicating detection of an ADC input that is within the comparison window of the window comparator, a third data flag indicating an overflow or underflow condition at the ADC. The data flags may be provided to control systems in communication with the digital sensing device through the serial interface block 28, such as through the dataout Dout port.

The above detailed descriptions are provided to illustrate specific embodiments of the present invention and are not intended to be limiting. Numerous modifications and variations within the scope of the present invention are possible. The present invention is defined by the appended claims.

We claim:

1. A digital sensing device including a plurality of input channels receiving one or more analog input signals from a sensor, the digital sensing device comprising:
    an input multiplexer configured to select a pair of input channels from the plurality of input channels and to connect the selected input channel pair to respective output nodes;
    an input buffer comprising a first input terminal and a second input terminal coupled to respective output nodes of the input multiplexer, the input buffer configured to generate buffered signals from the analog input signals selected by the input multiplexer;
    an analog-to-digital converter configured to receive the buffered signals and to generate digital values indicative of the selected analog input signals; and
    a sensor diagnostic system configured to detect sensor fault conditions, comprising:
        a first burnout current source providing a first burnout current and a second burnout current source providing a second burnout current, the first and second burnout current sources being multiplexed by the input multiplexer to be switchably connected to a selected input channel of the plurality of input channels, the input multiplexer being configured to apply the first or second burnout current to an input channel that is either currently selected or not currently selected by the input multiplexer as an input channel of the selected input channel pair; and a near-rail detector coupled to the first and second input terminals of the input buffer and configured to detect when a voltage on one of the first and second input terminals of the input buffer is near a positive power supply or near a negative power supply and to generate a signal indicative of a near-rail condition.

2. The digital sensing device of claim 1, wherein the analog-to-digital converter comprises a ΣΔ modulator configured to generate a single bit digitized data stream having a density of logic ones representative of the magnitude of the analog input signal, wherein the sensor diagnostic system further comprises:

an overload detector configured to detect when the data stream generated by the ΣΔ modulator having a number of consecutive ones or zeros that exceeds a first threshold, the overload detector generating a signal indicative of an overload condition in response to the data stream generated by the ΣΔ modulator having a number of consecutive ones or zeros exceeding the first threshold.

3. The digital sensing device of claim 1, wherein the sensor diagnostic system further comprises:

a window comparator configured to detect when the digital values generated by the analog-to-digital converter are within a given comparison window, the comparison window defining values within a positive threshold and a negative threshold around a zero digital value.

4. The digital sensing device of claim 3, wherein the positive threshold and the negative threshold defining the comparison window are programmable.

5. The digital sensing device of claim 1, wherein the sensor diagnostic system further comprises:

a sensor flag generator configured to generate data flags indicative of the sensor fault conditions, including the near-rail conditions detected by the near-rail detector.

6. The digital sensing device of claim 1, wherein the input multiplexer is operated in a scan mode to select each of the plurality of input channels in turn and to apply the first or second burnout current to an input channel that was previously selected by the input multiplexer as an input channel of the selected input channel pair.

7. The digital sensing device of claim 6, wherein the input multiplexer is operated so that the first or second burnout current is applied to an input channel not currently being evaluated by the analog-to-digital converter as an input channel of the selected input channel pair, so that normal ADC operation is not affected by the burnout current injection, and the burnout current injection does not affect the analog input signals from the sensor, the sensor diagnostic system being operated to detect sensor fault conditions entirely in the background of the normal ADC operation.

8. A digital sensor system, the digital sensing device comprising:

a sensor configured to sense a physical state or condition, and output an analog signal corresponding to a sensed physical stat or condition;

a sensor analog front end (AFE) configured to receive the analog signal from the sensor, the AFE including:

a plurality of input channels receiving one or more analog input signals from the sensor an input multiplexer configured to select a pair of input channels from the plurality of input channels and to connect the selected input channels to output nodes;

an input buffer comprising a first input terminal and a second input terminal coupled to respective output nodes of the input multiplexer, the input buffer configured to generate buffered signals from the analog input signals selected by the input multiplexer;

an analog-to-digital converter configured to receive the buffered signals and to generate digital values indicative of the selected analog input signals; and a sensor diagnostic system configured to detect sensor fault conditions, comprising:

a first burnout current source providing a first burnout current and a second burnout current source providing a second burnout current, the first and second burnout current sources being multiplexed by the input multiplexer to be switchably connected to a selected input channel pair of the plurality of input channels, the input multiplexer being configured to apply the first and second burnout currents to an input channel pair that is either currently selected or not currently selected by the input multiplexer independent of the selection of a pair of input channels; and a near-rail detector coupled to the first and second input terminals of the input buffer and configured to detect when a voltage on one of the first and second input terminals of the input buffer is near a positive power supply or near a negative power supply and to generate a signal indicative of a near-rail condition.

9. The system of claim 8, wherein the analog-to-digital converter comprises a ΣΔ modulator configured to generate a single bit digitized data stream having a density of logic ones representative of the magnitude of the analog input signal, wherein the sensor diagnostic system further comprises:

an overload detector configured to detect when the data stream generated by the ΣΔ modulator having a number of consecutive ones or zeros that exceeds a first threshold, the overload detector generating a signal indicative of an overload condition in response to the data stream generated by the ΣΔ modulator having a number of consecutive ones or zeros exceeding the first threshold.

10. The system of claim 8, wherein the sensor diagnostic system further comprises:

a window comparator configured to detect when the digital values generated by the analog-to-digital converter are within a given comparison window, the comparison window defining values within a positive threshold and a negative threshold around a zero digital value.

11. The system of claim 10, wherein the positive threshold and the negative threshold defining the comparison window are programmable.

12. The system of claim 8, wherein the sensor diagnostic system further comprises:

a sensor flag generator configured to generate data flags indicative of the sensor fault conditions, including the near-rail conditions detected by the near-rail detector.

13. The system of claim 8, wherein the input multiplexer is operated in a scan mode to select each of the plurality of input channels in turn and to apply the first or second burnout current to an input channel that was previously selected by the input multiplexer as an input channel of the selected input channel pair.

14. The system of claim 13, wherein the input multiplexer is operated so that the first or second burnout current is applied to an input channel not currently being evaluated by the analog-to-digital converter as an input channel of the selected input channel pair, so that normal ADC operation is not affected by the burnout current injection, and the burnout current injection does not affect the analog input signals from the sensor, the sensor diagnostic system being operated to detect sensor fault conditions entirely in the background of the normal ADC operation current injection.

15. An sensor analog front end (AFE) including a plurality of input channels receiving one or more analog input signals from a sensor, the sensor AFE comprising:
  an input multiplexer configured to select a pair of input channels from the plurality of input channels and to connect the selected input channels to output nodes;
  an input buffer comprising a first input terminal and a second input terminal coupled to respective output nodes of the input multiplexer, the input buffer configured to generate buffered signals from the analog input signals selected by the input multiplexer;
  an analog-to-digital converter configured to receive the buffered signals and to generate digital values indicative of the selected analog input signals; and
  a sensor diagnostic system configured to detect sensor fault conditions, including a first burnout current source providing a first burnout current and a second burnout current source providing a second burnout current, the first and second burnout current sources being multiplexed by the input multiplexer to be switchably connected to a selected input channel pair of the plurality of input channels, the input multiplexer being configured to apply the first and second burnout currents to an input channel pair that is either currently selected or not currently selected by the input multiplexer independent of the selection of a pair of input channels.

16. The sensor AFE of claim 15, wherein the sensor diagnostic system further comprises:
  a near-rail detector coupled to the first and second input terminals of the input buffer and configured to detect when a voltage on one of the first and second input terminals of the input buffer is near a positive power supply or near a negative power supply and to generate a signal indicative of a near-rail condition.

17. The sensor AFE of claim 16, wherein the sensor diagnostic system further comprises:
  a sensor flag generator configured to generate data flags indicative of the sensor fault conditions, including the near-rail conditions detected by the near-rail detector.

18. The sensor AFE of claim 15, wherein the input multiplexer is operated in a scan mode to select each of the plurality of input channels in turn and to apply the first or second burnout current to an input channel that was previously selected by the input multiplexer as an input channel of the selected input channel pair.

19. The sensor AFE of claim 18, wherein the input multiplexer is operated so that the first or second burnout current is applied to an input channel not currently being evaluated by the analog-to-digital converter as an input channel of the selected input channel pair, so that normal ADC operation is not affected by the burnout current injection, and the burnout current injection does not affect the analog input signals from the sensor, the sensor diagnostic system being operated to detect sensor fault conditions entirely in the background of the normal ADC operation current injection.

\* \* \* \* \*